US005191336A

United States Patent [19]

Stephenson

[11] Patent Number: 5,191,336

[45] Date of Patent: Mar. 2, 1993

[54] DIGITAL TIME INTERPOLATION SYSTEM

[75] Inventor: Paul Stephenson, Pleasanton, Calif.

[73] Assignee: Hewlett-Packard Company, Palo Alto, Calif.

[21] Appl. No.: 751,488

[22] Filed: Aug. 29, 1991

[51] Int. Cl.[5] .............................................. H03M 1/64

[52] U.S. Cl. ..................................... 341/111; 341/113

[58] Field of Search ............... 341/111, 112, 113, 114, 341/115, 118, 122, 132; 324/83 R, 83 D; 364/569; 328/129.1, 133

[56] References Cited

U.S. PATENT DOCUMENTS 4,253,051 2/1981 Schneider .......................... 318/632

OTHER PUBLICATIONS

Wolfgang Meiling and Franz Stary, *Nanosecond Pulse Techniques*, Cntrl Inst Nuclear Res of Deutsche Akademie Der Wissenschaften zu Berlin, Dept Nuclear Physics Rossendorf near Dresden, 1968, pp. 215–246.

Dan I. Porat, "Review of Sub-Nanosecond Time-Interval Measurements," *IEEE Transactions on Nuclear Science*, vol. NS-20, No. 5, Oct. 1973, pp. 36–51.

J. C. Brenot, J. A. Fayeton, and J. C. Houver, "Fast Multichannel Time Correlator for Coincidence Experiments in Atomic Physics," *Rev. Sci. Instrum.* 51(12) Dec. 1980, pp. 1623–1629.

C. Legrêle and J. C. Lugol, "A One Nanosecond Resolution Time-to-Digital Converter," *IEEE Transactions on Nuclear Science*, vol. NS-30, No. 1, Feb. 1983, pp. 297–300.

Satish K. Dhawan, "Time Measurement with a Multiphase Clock," *IEEE Transactions on Nuclear Science*, vol. NS-30, No. 1, Feb. 1983, pp. 293–296.

Juha Kostamovaara and Risto Myllylä, "Time-to-Digital Converter with an Analog Interpolation Circuit," *Rev. Sci. Instrum. 57(11), Nov. 1986, pp. 2880–2885.*

Paul S. Stephenson, "Frequency and Time Interval Analyzer Measurement Hardware," *Hewlett-Packard Journal*, Feb. 1989, pp. 35–41.

*Primary Examiner*—A. D. Pellinen

*Assistant Examiner*—B. K. Young

[57] ABSTRACT

A digital time interpolation system and method for quantizing the time-difference between two digital signals. The present invention measures the time-difference between consecutive zero crossings of a user signal and a reference oscillator. The present invention outputs interpolator data, which represents this time-difference in digital form. The present invention includes a quadrature hybrid, a synchronizer, track-and-holds (T&Hs), analog-to-digital converters (ADC), an encoding circuit, and a boundary detector. The present invention also includes a system for deskewing the recorded coarse time count and the fine time value. According to the present invention, the reference oscillator is a continuous, two-phase signal having a unique pair of output values at any given instant of its period. By using this reference oscillator, the present invention accelerates conversion. The present invention uses a novel boundary detection scheme. By using this boundary detection scheme, the present invention avoids the timing errors which are traditionally introduced by measuring synchronizer outputs directly.

18 Claims, 16 Drawing Sheets

DIGITAL TIME INTERPOLATION SYSTEM

BACKGROUND OF THE INVENTION

1. Field of the Invention

The present invention relates generally to systems and methods for measuring time with respect to digital signals, and more particularly to systems and methods for digital time interpolation with respect to digital signals.

2. Related Art

FIG. 1 illustrates a time-varying user signal 104. The frequency of the user signal 104 may be determined by determining the time-difference between consecutive positive zero crossings of the user signal 104 (indicated by A and C). This time-difference is indicated by X.

The time-difference between consecutive zero crossings of the user signal 104 (that is, X) is conventionally determined by using a reference signal 102. Specifically, the time-difference between a positive zero crossing of the user signal 104 (indicated by A) and the immediately following positive zero crossing of the reference signal 102 (indicated by B) is first quantized. Then, the time-difference between the next positive zero crossing of the user signal 104 (indicated by C) and the immediately following positive zero crossing of the reference signal 102 (indicated by D) is quantized. Techniques for using Y and Y' to determine the time-difference between consecutive positive zero crossings of the user signal 104 (that is, X) are well known.

Time-differences between two digitqal signals (such as the reference signal 102 and the user signal 104) are quantized by using digital time interpolation techniques. Many such digital time interpolation techniques currently exist.

For example, vernier devices measure "expanded time" by using a relatively slow time-to-amplitude/amplitude-to-expanded time converter. Alternatively, vernier principal devices measure expanded time by using two clocks of slightly different periods and counting the number of periods until the phases of the two channels are in coincidence. Vernier devices are flawed, however, since they require proportionally longer conversion times for increased time resolution. Consequently, "dead-time" between measurements increases.

Minimizing dead-time is important because dead-time limits the rate at which measurements can be made (instrument dead-time, in some cases, is directly proportional to the time required to interpolate).

Startable ramp interpolators require triggered ramps to start on an asynchronous event and to stop on a synchronized clock edge. Startable ramp interpolators are flawed, however, because they introduce jitter, non-linearities, and reset times. The jitter and non-linearities limit resolution. The reset times contribute to dead-time.

Multiple-phase clock interpolators (such as ring oscillators) require many matched delays (at least one per resolution element). Multiple-phase clock interpolators are flawed since they suffer from square root of N jitter increases (where N is the number of active clock delay elements and jitter is the amount of jitter present in one delay element).

SUMMARY OF THE INVENTION

The present invention is directed to a digital time interpolation system and method of quantizing the time-difference between two digital signals.

The present invention measures the time-difference between consecutive zero crossing of a user signal and a reference oscillator. The present invention outputs interpolator data, which represents this time-difference in digital form.

The present invention includes a quadrature hybrid, a synchronizer, track-and-holds (T&Hs), analog-to-digital converters (ADC), an encoding circuit, and a boundary detector.

The quadrature hybrid divides the reference oscillator into two signals, wherein the signals are out of phase with each other by 90 degrees. The T&Hs sample the two signals upon the occurrence of an event. The event is generated upon zero crossings of the user signal. The ADCs digitize the sampled signals. The encoder generates a fine time value according to the digitized signals.

The synchronizer measures and synchronizes the reference oscillator with the event signal. The boundary detector quantizes a recorded coarse time count.

The present invention also includes a system for deskewing the recorded coarse time count and the fine time value.

According to the present invention, the reference oscillator is a continuous, two-phase signal having a unique pair of output values at any given instant of its period. By using this reference oscillator, the present invention accelerates conversion.

The present invention uses a novel boundary detection scheme. By using this boundary detection scheme, the present invention avoids the timing errors which are traditionally introduced by measuring synchronizer outputs directly.

FEATURES AND ADVANTAGES OF THE INVENTION

The continuous time interpolator of the present invention includes the following features and advantages.

The present invention avoids the use of conventional time-to-amplitude conversion circuits that must be started and/or stopped by the events being measured. Instead, the present invention uses two quadrature-phase reference oscillators. The quadrature-phased reference oscillators provide a continuous time to amplitude/slope reference that is sampled on-the-fly. This allows time intervals to be measured continuously without the dead time and jitter effects associated with conventional techniques.

The dual slope nature of the reference oscillator allows a given analog-to-digital converter (ADC) to have effectively twice the resolution since its full range is used on both the positive and negative slopes of the reference oscillator.

Conventional interpolator techniques measure from an event edge to a synchronized clock edge. This forces any error due to the synchronization process into the measurement itself. The present invention avoids these errors by measuring the event edge directly against the reference oscillator and "pushes-off" the synchronization to a less critical portion of the measurement process. This de-sensitizes the measurement to synchronizer errors with magnitude less than half the reference oscillator period. The only use of the synchronizer output is in a boundary detection portion of the system.

The advantages of the present invention over multiple-phase clock interpolators include lower jitter due to reduction from N active clock delay elements (where N equals the number of resolution elements in the interpolator) to one clock driver for a track and hold cirucit. This reduces jitter by a factor of square root of N for equivalent technology clock delay/driver elements. Also, linearity of multiple-phase clock interpolators is dependent on matching many active delays. This could place serious linearity limits on an active delay based system. The present invention only requires a single matched delay element for the clocks to two track-and-hold circuits which can easily be adjusted to match during instrument calibration.

Multiple phase clocks could be generated passively (to reduce jitter), but technical difficulties result from adding a large number of taps to a single delay line (such as reduced edge speed, impedance matching, and series resistance). This can be addressed to some extent with a series-parallel delay line architecture. However, more input power is required to retain the same signal power at the loads due to power splitting going from the series to the parallel delay lines. Also, passive delay architectures are not easily integrated on to a chip due to the large values of delay required at this time. Therefore, the present invention offers superior resolution over multiple-phase clock interpolators of all kinds.

Further features and advantages of the present invention, as well as the structure and operation of various embodiments of the present invention, are described in detail below with reference to the accompanying drawings. In the drawings, like reference numbers indicate identical or functionally similar elements. Additionally, the left-most digit of a reference number identifies the drawing in which the reference number first appears.

BRIEF DESCRIPTION OF THE DRAWINGS

The present invention will be described with reference to the accompanying drawings, wherein:

FIG. 8C illustrates the manner in which FIGS. 8A and 8B are combined.

DETAILED DESCRIPTION OF THE PREFERRED EMBODIMENTS

1. Reference Oscillator

The continuous time interpolator of the present invention quantizes the time-difference between two digital signals. In particular, the continuous time interpolator quantizes the time-difference between zero crossings of an electronic test instrument's input signal (also called the "event edge" or trigger) and a coarse time clock generated by a digital counter contained within the electronic test instrument.

Figure 6:
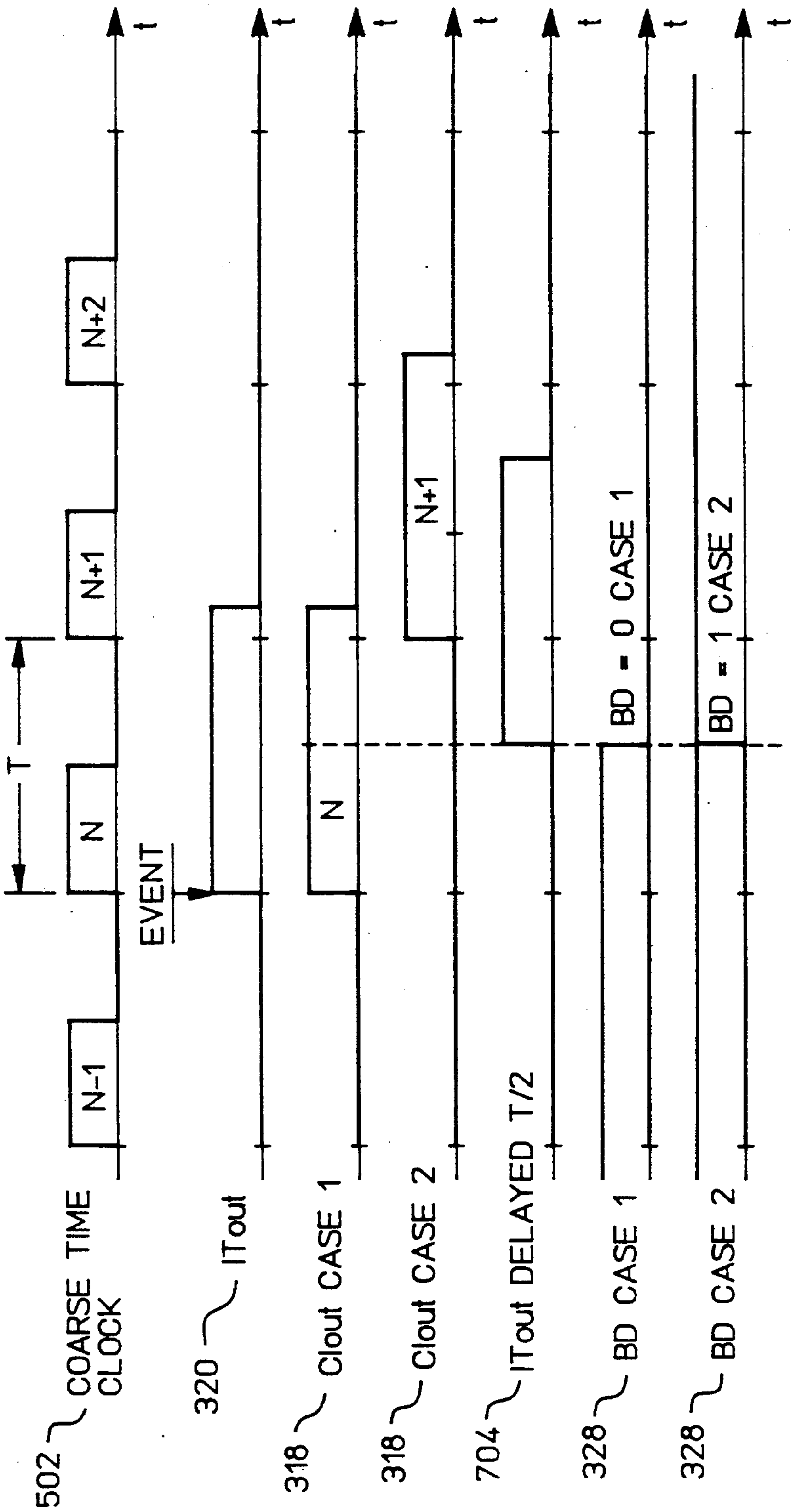
FIG. 6 presents a timing diagram of the outputs of a synchronizer.

The digital counter generates the coarse time clock by counting the rising edges of the reference oscillator. This count is called a coarse time count, or coarse time counter. For example, the coarse time count equals N after the occurrence of N rising edges of the reference oscillator. The coarse time clock is a representation of the coarse time count as it varies with time. FIG. 6 illustrates the coarse time clock. The coarse time clock is further described below.

Figure 1:
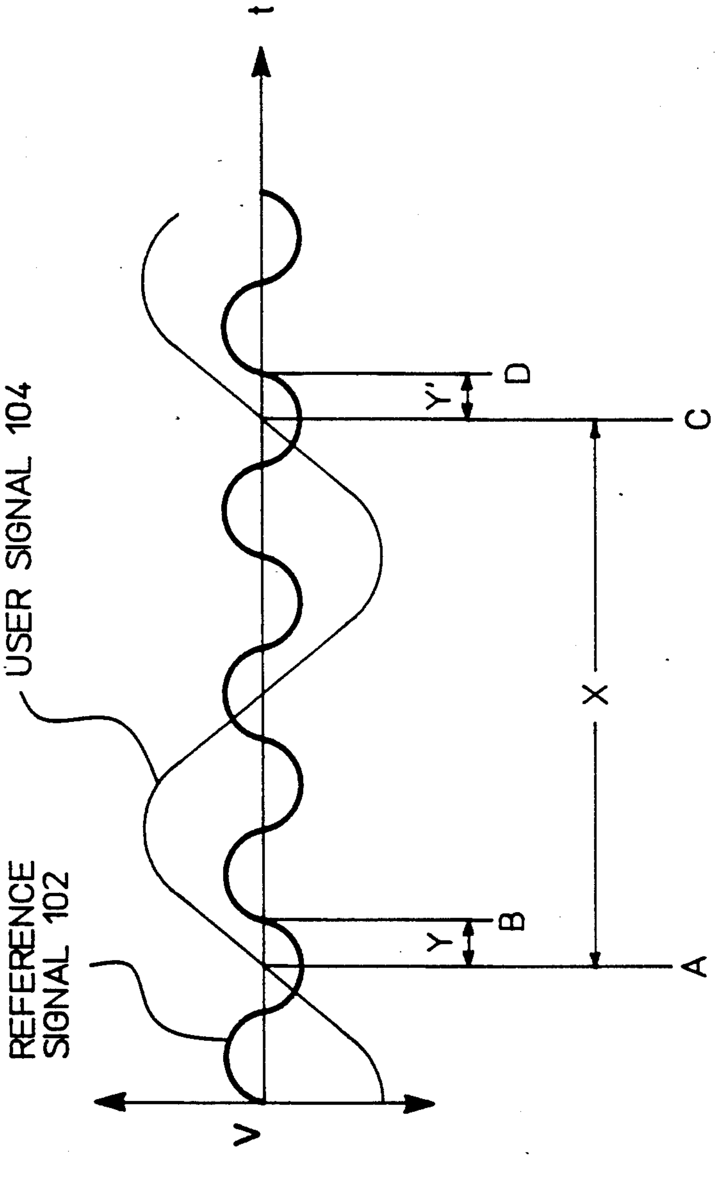
FIG. 1 illustrates a time-varying user signal.
Figure 2A:
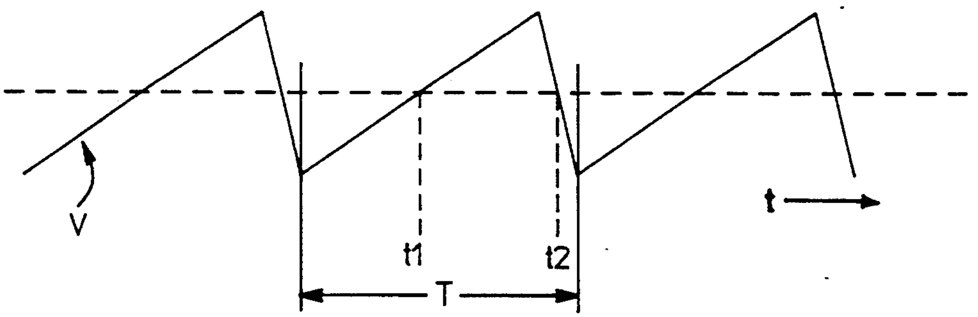
FIG. 2A illustrates a non-ideal sawtooth.
Figure 2B:
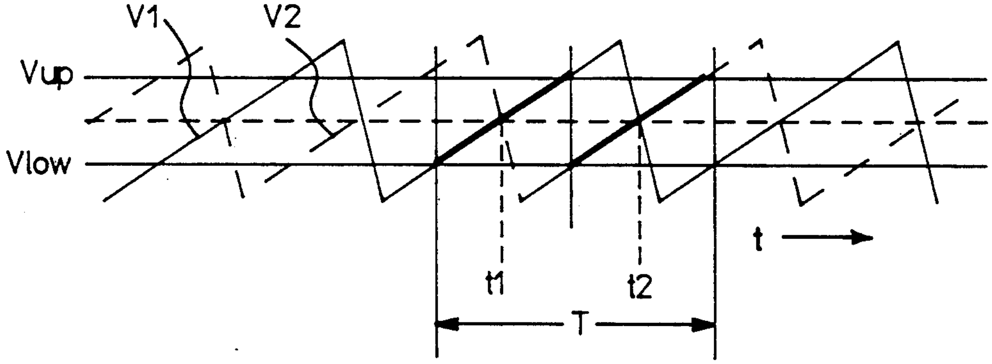
FIG. 2B illustrates a two-phase non-ideal sawtooth.
Figure 2C:
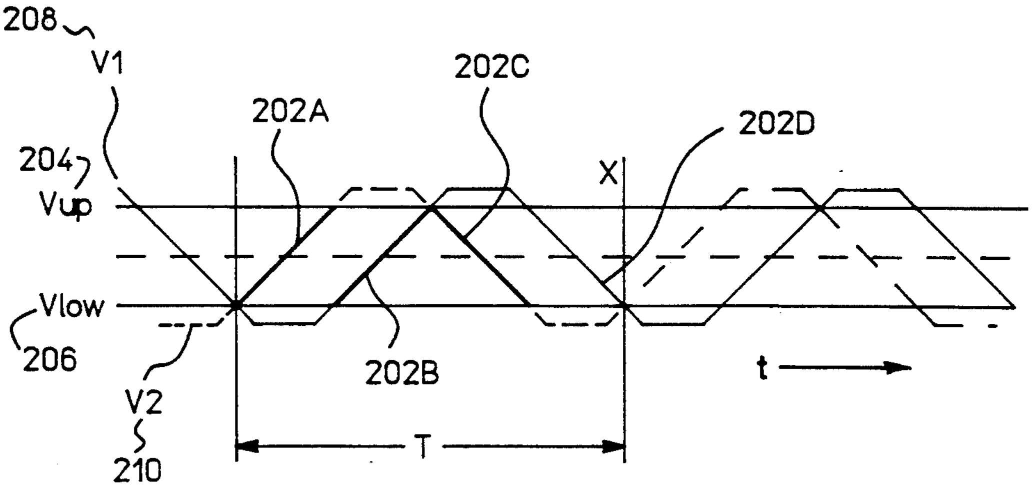
FIG. 2C illustrates a reference oscillator of the present invention as a trapezoidal waveform.

According to the present invention, the reference oscillator is a continuous, two-phase signal having a unique pair of output values at any given instant of its period. FIG. 2C illustrates the reference oscillator of the present invention as a trapezoidal waveform. Two phases of the trapezoidal waveform (indicator by V1 208 and V2 210) are shown in FIG. 2C. These phases differ by 90 degrees.

The reference oscillator of the present invention may also be implemented using a triangle waveform or a sinusoidal waveform.

In theory, the reference oscillator could be implemented using a single, ideal sawtooth having (1) monotonically increasing voltage proportional to time, (2) zero fall time, and (3) a period T equal to the period of the coarse time clock. However, this ideal reference cannot be realized without infinite bandwidth (for zero fall time). FIG. 2A illustrates a non-ideal sawtooth. Note that the non-ideal sawtooth does not have a unique pair of output values at any given instant of its period (since the output values at t1 and t2 are the same).

Additionally, the reference oscillator cannot be properly implemented using a two-phase non-ideal sawtooth. FIG. 2B illustrates a two-phase non-ideal sawtooth. Note that the two-phase non-ideal sawtooth does not have a unique pair of output values at any given instant of its period (since the output values at t1 and t2 are the same).

Referring again to FIG. 2C, note that the two-phase signal of the present invention includes four quadrants: a first quadrant 202A, a second quadrant 202B, a third quadrant 202C, and a fourth quadrant 202D. These quadrants 202 are also called linear or quasi-linear regions. When a phase is in the linear or quasi-linear region, the phase is said to be in-range.

The linear or quasi-linear regions have a voltage upper bound (Vup) 204 and a voltage lower bound (Vlow) 206. Overflow occurs when the upper bound 204 is exceeded (that is, the value of the signal is greater than the upper bound 204). Underflow occurs when the lower bound 206 is exceeded (that is, the value of the signal is less than the lower bound 206).

As shown in FIG. 2C, when one phase is in the linear or quasi-linear region (that is, in-range), the other phase is outside the linear or quasi-linear region (that is, overflowed or underflowed). Thus, the slope of one phase may be determined by detecting the in-range, underflowed, or overflowed condition of the other phase.

By using a quadrature phase relationship between the two phases, the linear or quasi-linear regions of each reference signal 208, 210 can be used as a continuous, two-phase, time-to-amplitude/slope reference. Note that the quadrature phasing provides continuous coverage in time by arranging the four linear or quasi-linear regions of the two reference phases in a contiguous fashion. The slope of the in-range reference determines which of the two possible quadrants (first or third, second or fourth) is present.

As noted above, the reference oscillator of the present invention may be implemented using a trapezoidal waveform, a triangle waveform, or a sinusoidal waveform. Generally, the reference oscillator may be implemented using any waveform having the following properties.

First, the waveform must be a continuous wave function having a period T equal to the coarse clock period.

Second, the waveform must have two linear or quasi-linear regions. One of the regions must span at least 90 degrees with a positive slope. The other region must span at least 90 degrees with a negative slope. The two regions must be approximately equal in range and magnitude.

Third, the two linear or quasi-linear regions in a given phase are separated by 90 degrees.

Fourth, the two 90 degree portions used as slope indicators must have magnitudes greater than the most positive point in the 90 degree positive slope linear or quasi-linear region or magnitude less than the most negative point in the negative slope linear or quasi-linear region.

2. Structure and Operation of the Continuous Time Interpolator

Figure 3:
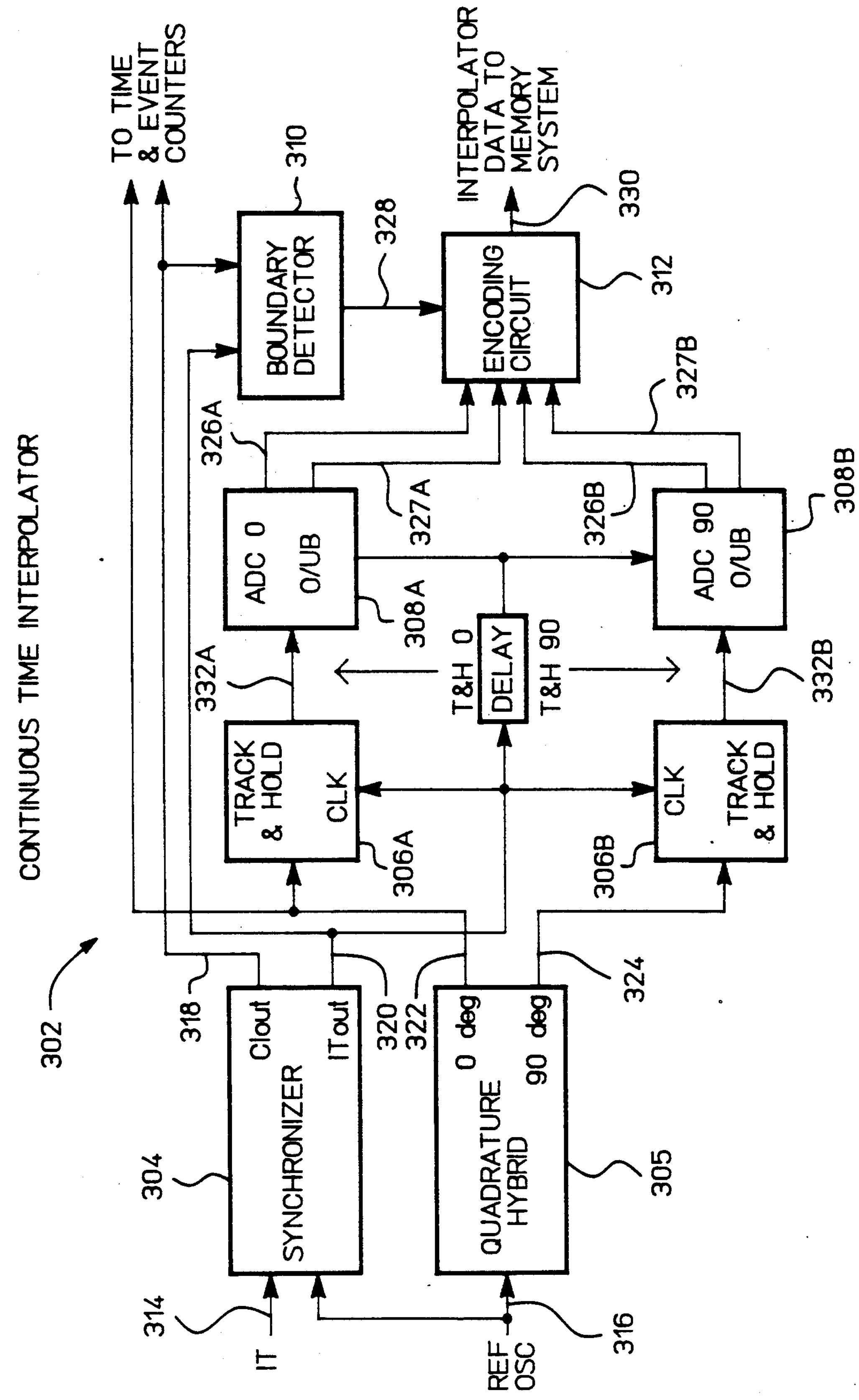
FIG. 3 illustrates a block diagram of the continuous time interpolator of the present invention.

FIG. 3 illustrates a block diagram of the continuous time interpolator 302 of the present invention. As shown in FIG. 3, the continuous time interpolator 302 receives as input an event edge (herein abbreviated as IT, for interpolator) 314 and a reference oscillator 316. The reference oscillator 316 is discussed above in Section 1.

The IT 314 corresponds to a user signal. The IT 314 is generated upon a zero crossing of the user signal. The continuous time interpolator 302 measures the time from the zero crossing of the user signal (that is, upon the occurrence of the IT 314) to the next zero crossing of the reference oscillator 316. The continuous time interpolator 302 outputs interpolator data 330, which represents this time difference between the zero crossings of the user signal and the reference oscillator. In the preferred embodiment of the present invention, the interpolator data 330 is 10 binary bits.

The are many well-known techniques for generating the IT 314. Any of these techniques may be used to achieve the present invention.

Figure 4:
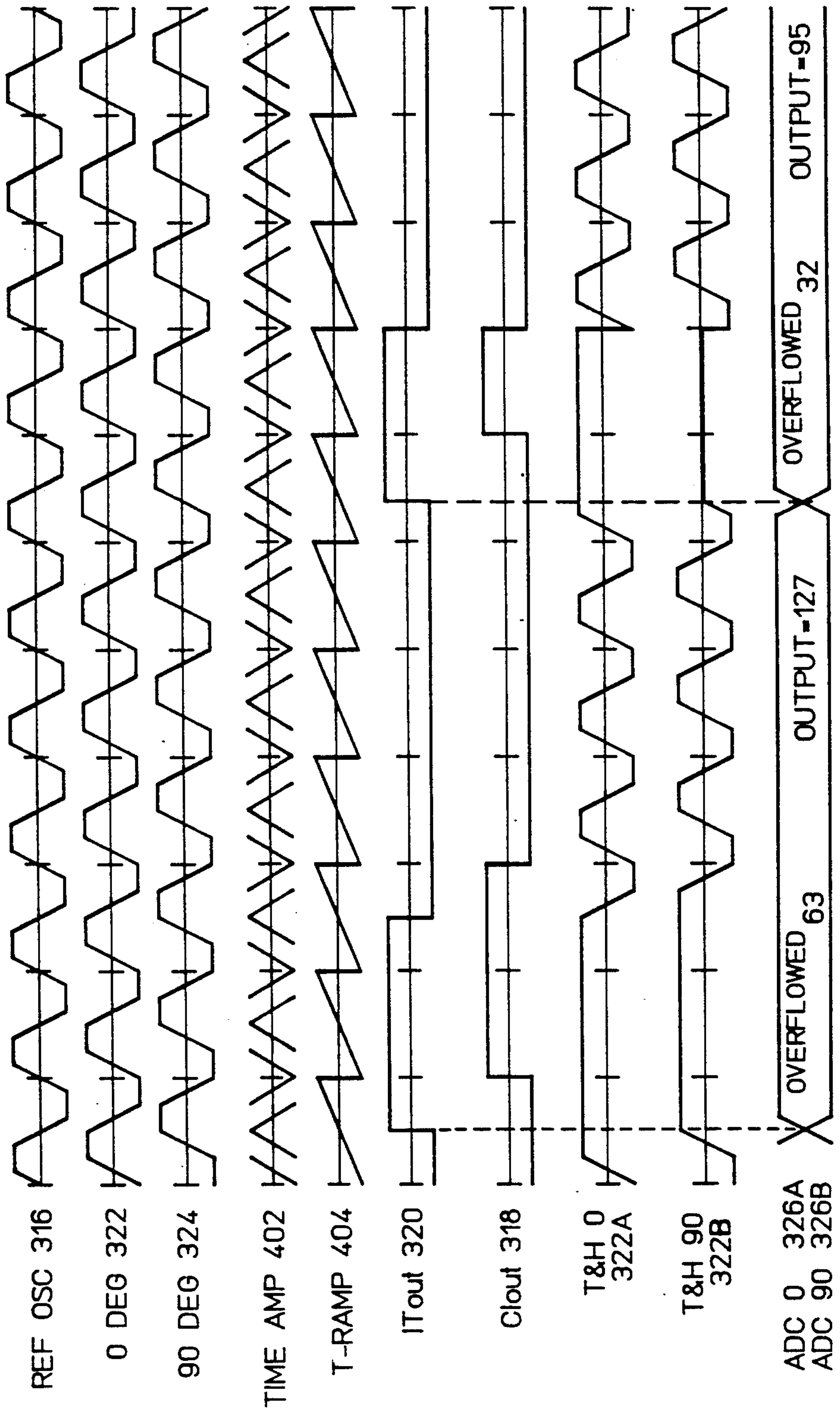
FIG. 4 presents a timing diagram of the continuous time interpolator.

As shown in FIG. 3, the continuous time interpolator 302 includes a quadrature hybrid 305, a synchronizer 304, track-and-holds (T&Hs) 306, analog-to-digital converters (ADC) 308, an encoding circuit 312, and a boundary detector 310. These components are described in detail below. The operation of these components, and of the continuous time interpolator 302 as a whole, is illustrated in FIG. 4, which presents a timing diagram of the continuous time interpolator 302.

2.1. Quadrature Hybrid

The quadrature hybrid 305 receives as input the reference oscillator 316.

The quadrature hybrid 305 divides the reference oscillator 316 into two approximately equal amplitude signals with one phase shifted ninety degrees with respect to the other. In this patent document, these signals are called the 0 degree signal 322 and the 90 degree signal 324.

The output of the quadrature hybrid 305 is illustrated in FIG. 2C, where the reference oscillator 316 is a trapezoidal waveform. In FIG. 2C, the 0 degree signal 322 is represented by V1 208 and the 90 degree signal 324 is represented by V2 210. This is also illustrated in FIG. 4.

As indicated in FIG. 3, the quadrature hybrid 305 outputs both the 0 degree signal 322 and the 90 degree signal 324.

2.2. Synchronizer

The synchronizer 304 receives the reference oscillator 316 and the IT 314. The synchronizer 304 measures and synchronizes IT 314 with the reference oscillator 316.

The synchronizer 304 contains a digital counter (not shown in FIG. 3). The digital counter in the synchronizer 304 uses the reference oscillator 316 to produce the coarse time clock.

Alternatively, the digital counter may be located outside of the synchronizer 304, in which case the synchronizer 304 would receive the coarse time clock as input.

The synchronizer 304 produces an output edge (CIout) 318 which corresponds to the rising edge of the coarse time clock which immediately follows IT 314.

More than one period of the reference oscillator 316 may be required to reliably produce CIout 318. Therefore, the synchronizer 304 delays IT 314 by the number of periods that is required to reliably produce CIout 318. The synchronizer 304 outputs the delayed IT 314 as ITout 320.

2.3. Track and Holds

The T&Hs 306A and 306B are samplers which capture analog samples of the 0 degree signal 322 and the 90 degree signal 324, respectively. ITout 320 simultaneously clocks both of the T&Hs 306. Thus, the 0 degree signal 322 and the 90 degree signal 324 are simultaneously sampled by the T&Hs 306. The track and holds 306 are a subset of voltage sampling circuits, which are well known to those skilled in the art. Any voltage sampling circuit could be used for the track and holds 306 of the present invention.

2.4. ADC

The ADCs 308 receive the T&H outputs 332. In addition to clocking the T&Hs 306, the ITout 320 also clocks the ADCs 308 such that the ADCs 308 receive the T&H outputs 332. As shown in FIG. 3, however, ITout 320 is delayed long enough to allow the T&H outputs 332 to settle before being clocked into the ADCs 308.

The operation of the ADCs 308 of the present invention is similar to the operation of conventional analog-to-digital converters. The ADCs 308 generate digital representations of the analog T&H outputs 332. These digital representations are sent as ADC outputs 326 to the encoding circuit 312.

The amplitudes of the 0 degree signal 322 and the 90 degree signal 324 are set so that both zero and full-scale ADC outputs 326 correspond to the upper bound 24 and lower bound 206 of the linear or quasi-linear regions. Alternatively, this is accomplished by appropriately setting the full-scale input ranges of the ADCs 308.

In addition of the ADC outputs 326, the ADCs 308 have overflow and underflow status bits (O/UB) 327. The O/UBs 327 indicate when the input (that is, the T&H output 332) are offscale (either positively or negatively). The O/UBs 327 allow stacking multiple ADCs 308 in parallel to obtain a larger dynamic range.

In the embodiment illustrated in FIG. 3, the O/UBs 327 indicate when the 0 degree signal 322 and the 90 degree signal 324 are out of the linear or quasi-linear region. As noted above, when one is in the quasi-linear region, the other is out of the quasi-linear region. Additionally, the O/UBs 327 indicate the specific quadrant. For example, the 90 degree signal 324 is in the first quadrant 202A when the 0 degree signal 322 is underflowed (as indicated by O/UB 327A). The 0 degree signal 322 is in the second quadrant 202B when the 90 degree signal is overflowed (as indicated by O/UB 327B). Thus, the O/UBs 327 avoid the ambiguity between the first and third quadrants 202A, 202C (and the second and fourth quadrants 202B, 202D) which exists when only information from the in-range phase is used.

The present invention, as described above, effectively doubles the number of ADC resolution elements because the slope information provides an extra bit of time resolution. For example, when two six-bit ADCs are used the dynamic range is increased to a 8-bits. This is shown in Table 1, which represents an example wherein the continuous time interpolator 302 contains six-bit ADCs 308. Under this example, each ADC 308 would have 64 resolution elements. However, according to the present invention, the combination of the two ADCs 308 would give 256 resolution elements.

TABLE 1

| ADC 0 (308A) | ADC 90 (308B) | Intermediate Output | Quadrant |
|---|---|---|---|
| 0–63 | Underflowed | 0–63 | 1 |
| Overflowed | 0–63 | 64–127 | 2 |
| 63–0 | Overflowed | 128–191 | 3 |
| Underflowed | 63–0 | 192–255 | 4 |

The ADC outputs 326 and O/UBs 327 are as shown in the first two columns of Table 1 (that is, the ADC 0 and ADC 90 columns). The encoding circuit 312 interprets the ADC outputs 326 and O/UBs 327 and generates an intermediate output, which is illustrated in the third column of Table 1. The intermediate output represents a fraction of the least significant bit of the coarse time counter. The intermediate output is also called the fine time count. The encoding circuit 312 is described in a section below.

2.5. Boundary Detector

FIG. 4 illustrates two signals that reflect conceptual details of the interpolator 302, but which do not actually exist. These signals are Time Amp 402 and T-Ramp 404. Time Amp 402 is the four linear or quasi-linear sections of the reference phases placed side-by-side as they occur in time. T-Ramp 404 is a transformed version of Time Amp 402. The transformation is defined by Table 1. The transformation converts Time Amp 402 into monotonically increasing digital code proportional to the elapsed time from the previous positive zero crossing of the coarse time clock to the event edge being measured.

As shown in FIG. 4, there is a singularity at the transition of T-Ramp 404 from full-scale to zero. The singularity point represents the potential for large measurement error. This error can occur when the event edge (that is, IT 314) falls on or very close to the singularity. At these points the interpolator 302 may record either a zero or a full-scale output. Thus, the interpolator output 330 could be in error by one full period of the reference oscillator 316. Therefore, the interpolator output 330 must reflect the state of the coarse time counter.

Specifically, for a given event occurring at the singularity, the interpolator 302 may record zero. Thus, the coarse time counter must count one extra period than if the interpolator 302 recorded full-scale. Since the "correct" coarse time count is not known, there is no way to examine the coarse time count alone and correct the measured result. According to the present invention, this is solved by examining the fine time count together with the coarse time count to determine the "correct" coarse time count.

Conventional solutions to this problem involve (1) extending the range of the interpolator to cover more than one period (using a time-to-voltage ramp that spans two periods of the reference oscillator) and/or (2) measuring the time interval between the event edge and the output of the synchronizer (that is, the time interval from IT to CI).

A disadvantage of the first conventional solution is that it does not remove the singularity. Rather, the first conventional solution only avoids the singularity by using a non-continuous time-to-amplitude reference that spans more than one period T. This works for traditional counters as it forces the time-to-amplitude reference to be triggered by the event and then be sampled by the synchronizer output up to T seconds later. Thus, the singularity (or reset time) of the ramp is avoided. However, the first conventional solution does not provide a continuous time-to-amplitude reference as provided by the continuous time interpolator 302 of the present invention.

A disadvantage of the second conventional solution is that increased jitter and timing error from the synchronizer output is introduced into the measurement. Although measuring from the event edge (IT) to the synchronizer output (CI) automatically incorporates the coarse time recorded into the measurement, it forces the interpolator to record the jitter and time delay drift of the synchronizer.

The continuous time interpolator 302 of the present invention avoids the jitter and timing error introduced by the second conventional solution. This is done by examining the fine time count measured directly from the event edge (that is, not synchronized to the coarse time clock) and the output of the boundary detector 310. This eliminates a fine time measurement directly involving the synchronizer 304.

Figure 5A:
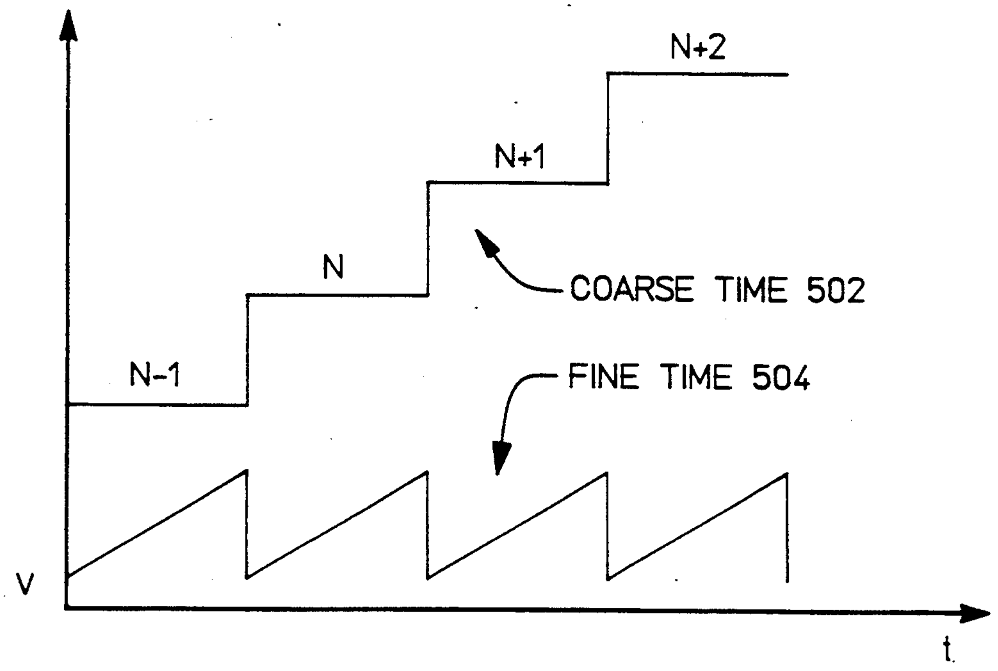
FIG. 5A shows an ideal relationship between a coarse time count 502 and a fine time count 504.
Figure 5B:
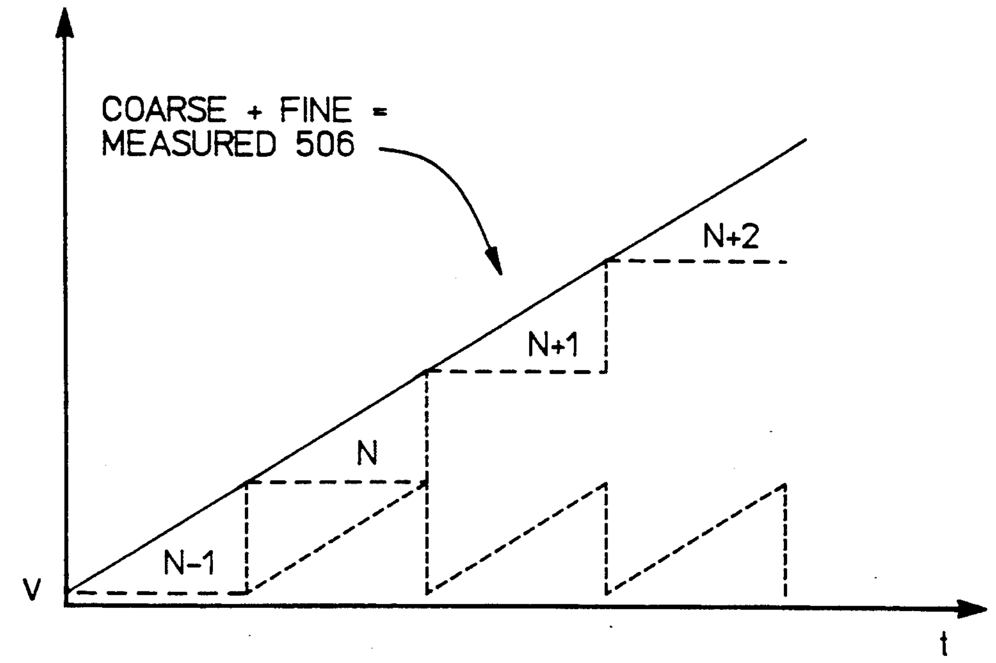
FIG. 5B illustrates a measured value 506, which is the sum of the coarse time count 502 and fine time count 504 from FIG. 5A.

FIG. 5A shows an ideal relationship between a coarse time count 502 and a fine time count 504. FIG. 5B illustrates a measured value 506, which is the sum of the coarse time count 502 and fine time count 504 from FIG. 5A.

Figure 5C:
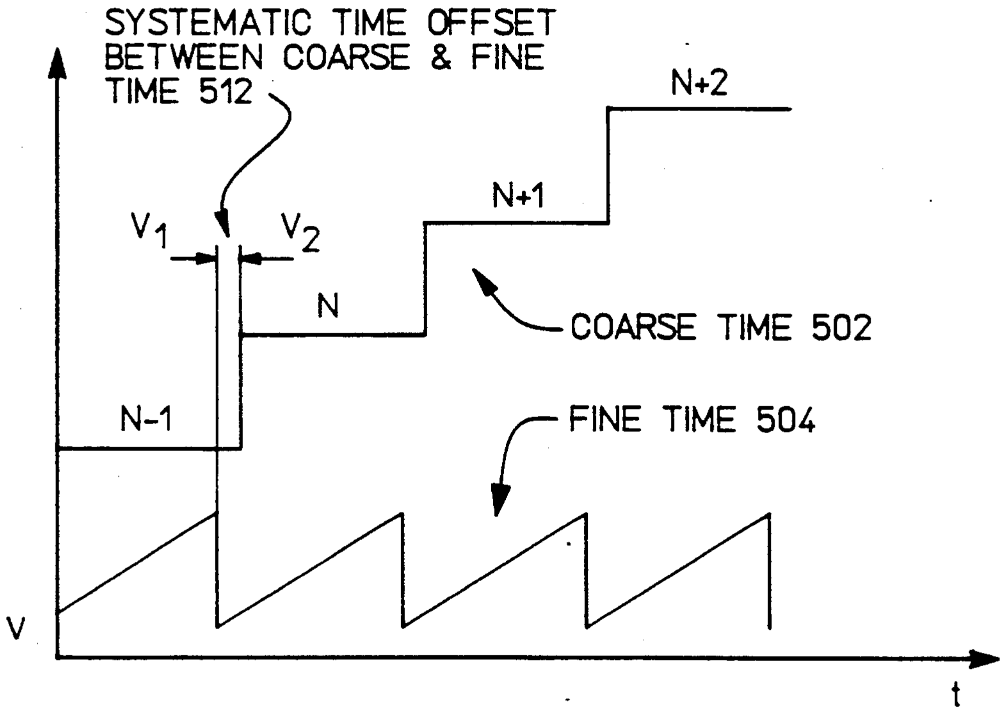
FIG. 5C shows the effect of a fixed time skew (that is, a systematic offset 512) between the coarse time count 502 and fine time count 504.
Figure 5D:
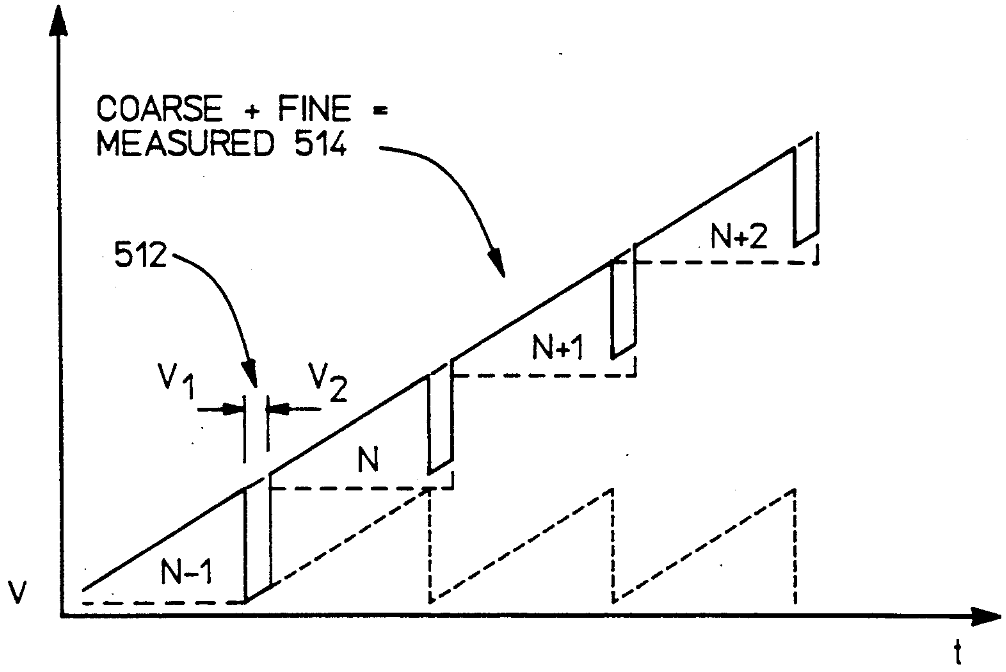
FIG. 5D illustrates a measured value 514, which is the sum of the coarse time count 502 and fine time count 504 from FIG. 5C.
Figure 5E:
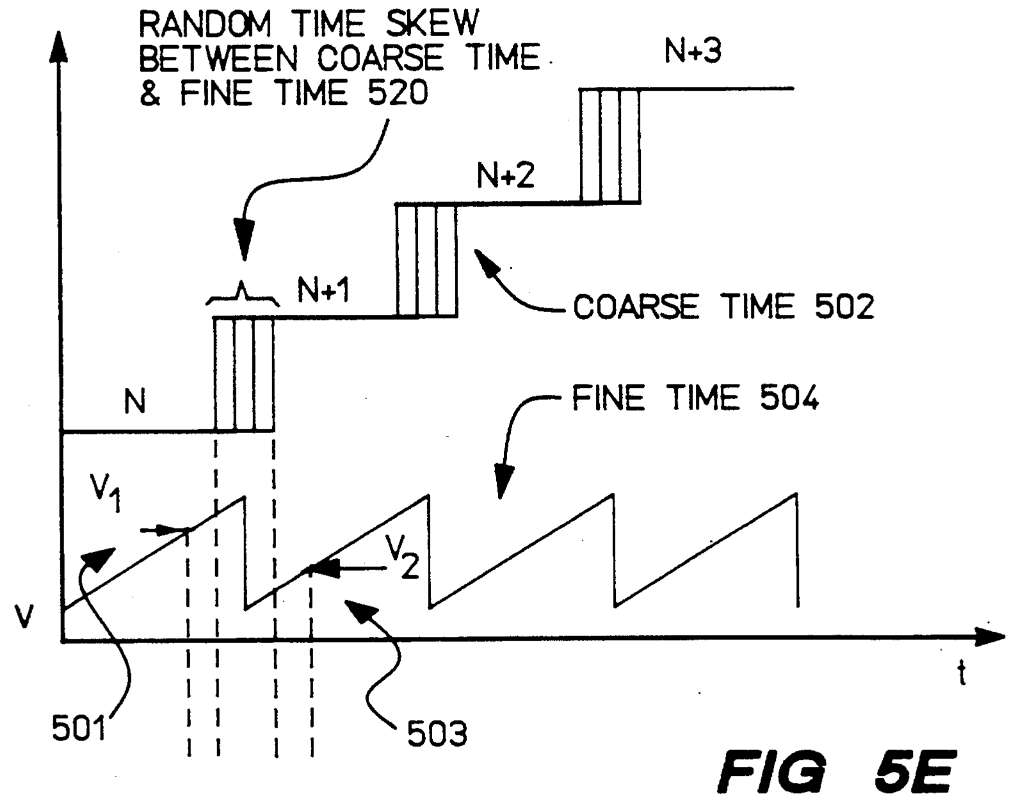
FIG. 5E shows the effect of a random time skew (jitter) between the coarse time count 502 and fine time count 504 about a singularity point.
Figure 5F:
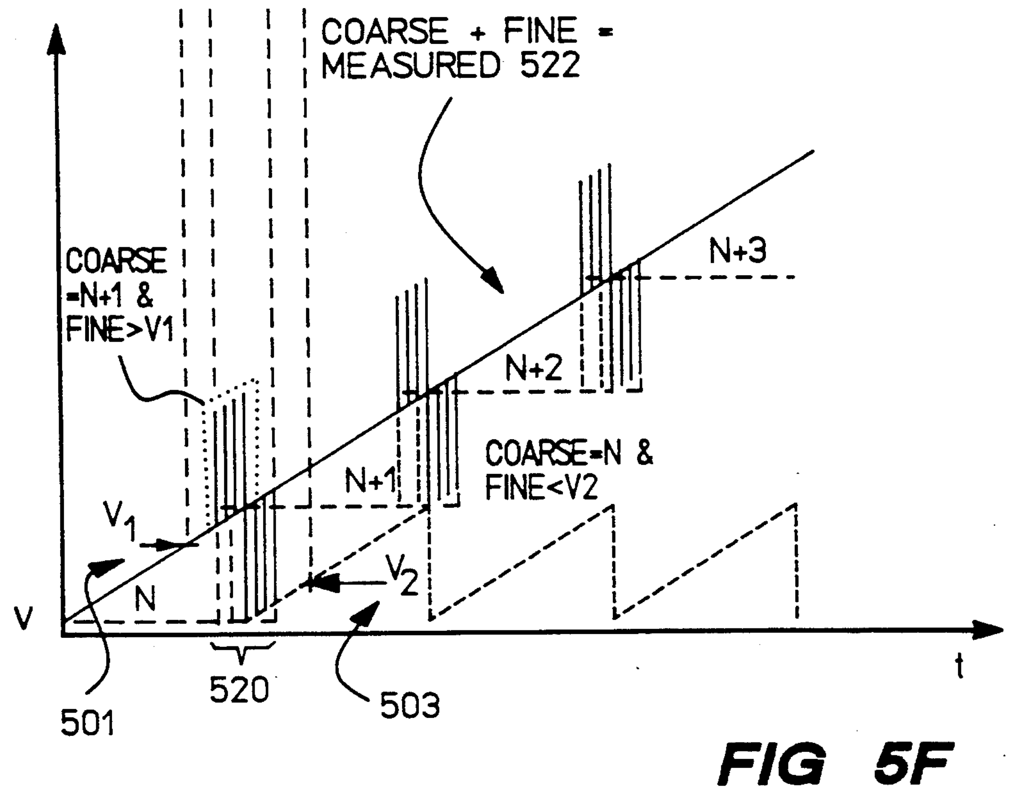
FIG. 5F illustrates a measured value 522, which is the sum of the coarse time count 502 and fine time count 504 from FIG. 5E.

FIGS. 5C, 5D, 5E, and 5F illustrate the manner in which real-world factors deviate from the ideal relationship shown in FIGS. 5A and 5B. FIGS. 5C and 5D show the effect of a fixed time skew (that is, a systematic offset 512) between the coarse time count 502 and fine time count 504. FIGS. 5E and 5F show the effect of a random time skew (jitter) between the coarse time count 502 and fine time count 504 about a singularity point.

Figure 7A:
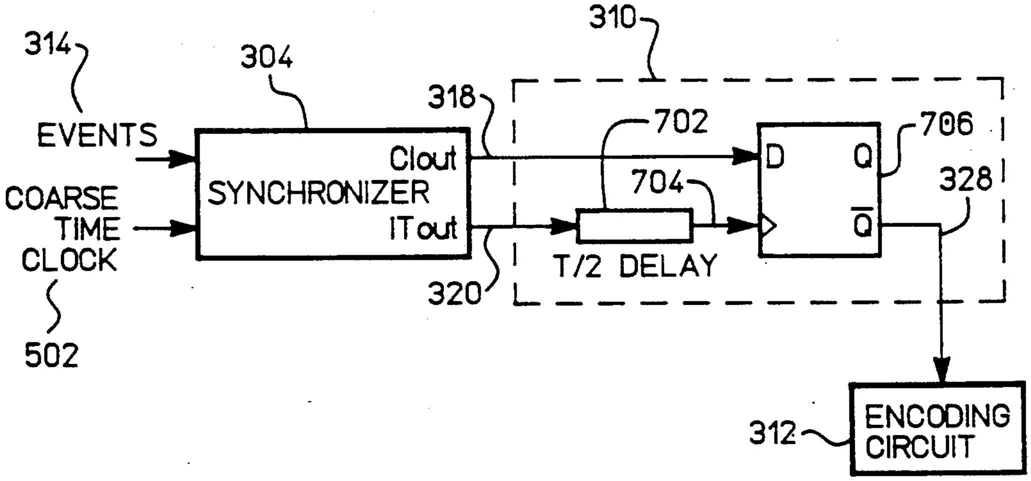
FIG. 7A shows a block diagram of a boundary detector.
Figure 7B:
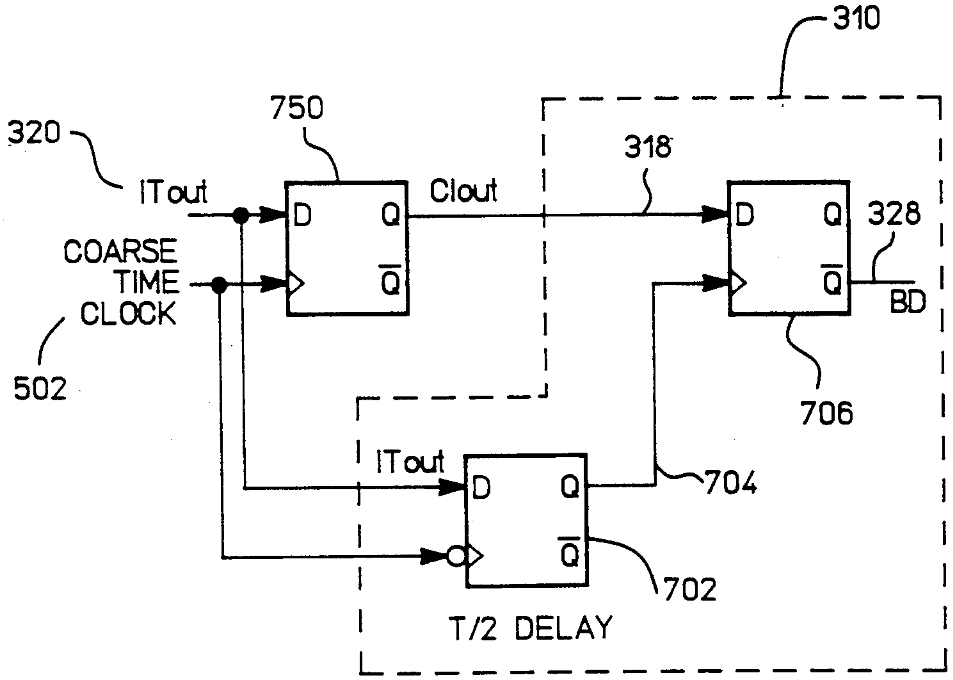
FIG. 7B illustrates the boundary detector in greater detail.

FIG. 6 presents a timing diagram of the outputs of the synchronizer 304 (that is, CIout 318 and ITout 320) and of the boundary detector 310. FIG. 7A shows a block diagram of the boundary detector 310. FIG. 7B illustrates the boundary detector 310 in greater detail.

The coarse time count is latched, or recorded, by CIout 318. This latched value of the coarse time count is called a recorded coarse time count. For example, referring to FIG. 6, the recorded coarse time count is N for CIout 318 case 1. The recorded coarse time count is N+1 for CIout 318 case 2.

Referring to FIGS. 6, 7A, and 7B, the boundary detector 310 determines if the recorded coarse time count is N or N+1. The boundary detector 310 operates by delaying ITout 320 with respect to CIout 318 by half a period of the reference oscillator 316 and then using a D flip-flop 706 to perform a binary phase comparison.

There are two cases. If CIout 318 is coincident with ITout 320 (that is, case 1 in FIG. 6), then the boundary detector (BD) bit 328 is low indicating that the recorded coarse count was N. If CIout 318 occurred one period after ITout 320 (that is, case 2 in FIG. 6), then the BD bit 328 is high indicating the recorded coarse time count was N+1.

The BD bit 328 has some conditions on its use. First, it has the same weight as the least significant bit (LSB) of the coarse time counter (that is, if the LSB of the coarse time counter has a weight of 1 second, then the BD bit 328 has a weight of 1 second). Thus, conceptually the BD bit 328 must be added to (or subtracted from) the coarse time counter. This is done by using a deskew algorithm, which is described below.

Secondly, there exists a small region of time where the value of the BD bit 328 is not deterministic. This region occurs where CIout 318 and ITout (delayed by T/2) 704 violate the set-up and hold requirements of the BD flip-flop 706. According to the present invention, this region is positioned so that it coincides with the midrange of the T-Ramp 404. In this region, the BD bit 328 is not needed to deal with the singularity problem, discussed above. Thus, to determine the validity of the BD bit 328, the fine time counter (also called the intermediate output) must be examined.

As shown in FIGS. 5E and 5F, two limits (V1 and V2) are established which bound the upper and lower intermediate output values outside the region around the singularity. Specifically, all values of the intermediate output which are less than V1 or greater than V2 are outside the region around the singularity. Conversely, all values of the intermediate output which are greater than or equal to V1 or less than or equal to V2 are inside the region which includes the singularity. Conceptually, the selection of V1 and V2 is not critical provided two conditions are met.

First, all random and systematic skew between the coarse time 502 and the fine time 504 must be contained between V1 and V2 as shown in FIGS. 5E and 5F.

Second, the region where the BD bit 328 is not deterministic must be outside the region defined by the first condition.

In practice, choosing V1 to be 75% of full-scale and V2 to be 25% of full-scale yields balanced system timing. This allows up to T/2 seconds of total systematic and random time skew between coarse time 502 and fine time 504 that is automatically corrected by the continuous time interpolator 302 via the deskew algorithm.

The deskew algorithm of the present invention operates as follows. The intermediate output is checked. If the intermediate output is less than V1 or greater than V2, then the BD bit 328 is ignored and the intermediate output is effectively added to the recorded coarse time without correction to give the measured value. The binary code 01 represents the output of the deskew algorithm for this case.

If intermediate output is greater than or equal to V1, or if the intermediate output is less than or equal to V2, then the values of the intermediate output and the BD bit 328 are checked. There are four cases.

The first case exists when the BD bit 328 is 1 and the intermediate output is greater than or equal to V1. If the first case exists, then the intermediate output is effectively added to the recorded coarse time minus 1 coarse time count to give the measured value. The binary code 00 represents the output of the deskew algorithm.

The second case exists when the BD bit 328 is 1 and the intermediate output is less than or equal to V2. If the second case exists, then the intermediate output is effectively added to the recorded coarse time without correction to give the measured value. The binary code 01 represents the output of the deskew algorithm.

The third case exists when the BD bit 328 is 0 and the intermediate output is greater than or equal to V1. If the third case exists, then the intermediate output is effectively added to the recorded coarse time without correction to give the measured value. The binary code 01 represents the output of the deskew algorithm.

The fourth case exists when the BD bit 328 is 0 and the intermediate output is less than or equal to V2. If the fourth case exists, then the intermediate output is effectively added to the recorded coarse time plus 1 coarse time count. The resulting binary code 10 represents the output of the deskew algorithm.

The two bits of the deskew algorithm output have weight equal to the LSB+1 and LSB of the coarse time counter. These two bits of the deskew algorithm output are appended (as the most significant bits) to the intermediate output to produce the interpolator output 330.

In the above paragraphs, the phrase "effectively added" indicates that the addition is not actually performed by the deskew algorithm. Instead, the deskew algorithm provides two bits which indicate the operation that must be later performed. Specifically, if the deskew algorithm output is 00, then the intermediate output must be added to the recorded coarse time minus 1 coarse time count. If the deskew algorithm output is 01, then the intermediate output must be added to the recorded coarse time. If the deskew algorithm output is 10, then the intermediate output must be added to the recorded coarse time plus 1 coarse time count. In the preferred embodiment of the present invention, the actual additions are performed by a post-processing element. In an alternative embodiment, however, the additions may be performed by the deskew algorithm.

Additionally, the deskew algorithm output can be used as a control signal to latch the coarse time immediately (code 00), or delayed by T (one coarse time clock period, code 01), or delayed by 2T (two coarse time clock periods, code 10), thereby recording the correct "deskewed" coarse time. This eliminates the need to append the two bits of the deskew algorithm to the intermediate result because they are automatically included in the coarse time result.

In summary, according to the present invention, jitter (which is less than T/2 in magnitude) due to the synchronizer 304 is not measured. This is because the event edge is interpolated to the reference oscillator 316 directly as opposed to being interpolated to Clout 318. Only the BD bit 328 is determined by the synchronizer outputs 318, 320. The BD bit 328 is not sensitive to jitter less than about T/2 (this is much larger than the resolution limit of the system).

2.6. Encoding Circuit

As noted above, the encoding circuit 312 processes the ADC outputs 326 and the O/UBs 327 in order to generate the intermediate output. In generating the intermediate output, the encoding circuit operates according to Table 1, above. Specifically, when the O/UB 327B indicates that the 90 degree signal 210 is underflowed, then the encoding circuit generates the intermediate output by using the ADC output 326A. When the O/UB 327A indicates that the 0 degree signal 208 is overflowed, then the encoding circuit uses the ADC output 326B to generate the intermediate output. When the O/UB 327B indicates that the 90 degree signal 210 is overflowed, then the encoding circuit uses the ADC output 326A to generate the intermediate output. When the O/UB 327A indicates that the 0 degree signal 208 is underflowed, then the encoding circuit uses the ADC output 326B to generate the intermediate output.

In the event that imperfections cause neither O/UB 327A nor O/UB 327B to underflow or overflow near the quadrant boundaries, additional arbitration logic is included in the encoding circuit. This arbitration logic systematically forces the encoding circuit to use the ADC output to one specified side of the imperfect quadrant boundary.

In the preferred embodiment of the present invention, wherein the ADCs 308 are each six-bit, the intermediate output is 8 bits. However, the interpolator output 330 is 10 bits. The interpolator output represents the least significant eight bits of the interpolator output 330.

The encoding circuit 312 may also process the output from the boundary detector 310 by performing the deskew algorithm, as described above. The encoding circuit 312 would take the two bits of the deskew algorithm output and append them as the two most significant bits of the interpolator output 330. According to this embodiment, the interpolator output 330 is generated entirely in hardware (wherein the components illustrated in FIG. 3 are hardware components).

In summary, the measured value 506 is determined by summing the coarse time count 502 of the digital counter and the interpolator output 330 while retaining the correct relative bit weightings. This is accomplished when the LSB and the LSB+1 of the coarse time count have the same weights as the MSB-1 and MSB (most significant bit) of the interpolator outputs.

Alternatively, the encoding circuit 312 may generate and store the intermediate output. Similarly, the boundary detector 310 may generate and store the BD bit 328. An external component, which may be either hardware or software, would then receive the intermediate output and the BD bit 328 and produce the interpolator output 330. This external component would also perform the deskew algorithm.

According to the present invention, the encoding circuit 312 reduces the number of bits that must be stored for each data point. Without the encoding circuit 312, the number of data bits that must be stored is as follows:

2×ADC bits+2×(overflow/underflow bits)+Boundary bit.

With the encoding circuit 312, the number of data bits that must be stored is reduced to the following:

Intermediate result+Boundary bit.

For six-bit ADCs 308, this means that the number of data bits that must be stored is reduced from 17 bits to 9 bits.

3. Interleaved Architecture for Increased Sampling Rates

Synchronizing the events to be measured may take a significant amount of time. Thus, the synchronization process may limit the rate at which measurements can be made. According to the present invention, higher sampling rates can be achieved by interleaving paralleled synchronizers and measurement channels. By doing this after the initial time-to-amplitude/slope sampling (performed by a first rank track-and-hold 306A), systematic and random components of time skew (up to T/2 seconds peak-to-peak) between paralleled measurement channels are eliminated from the measurement.

Figure 8A:
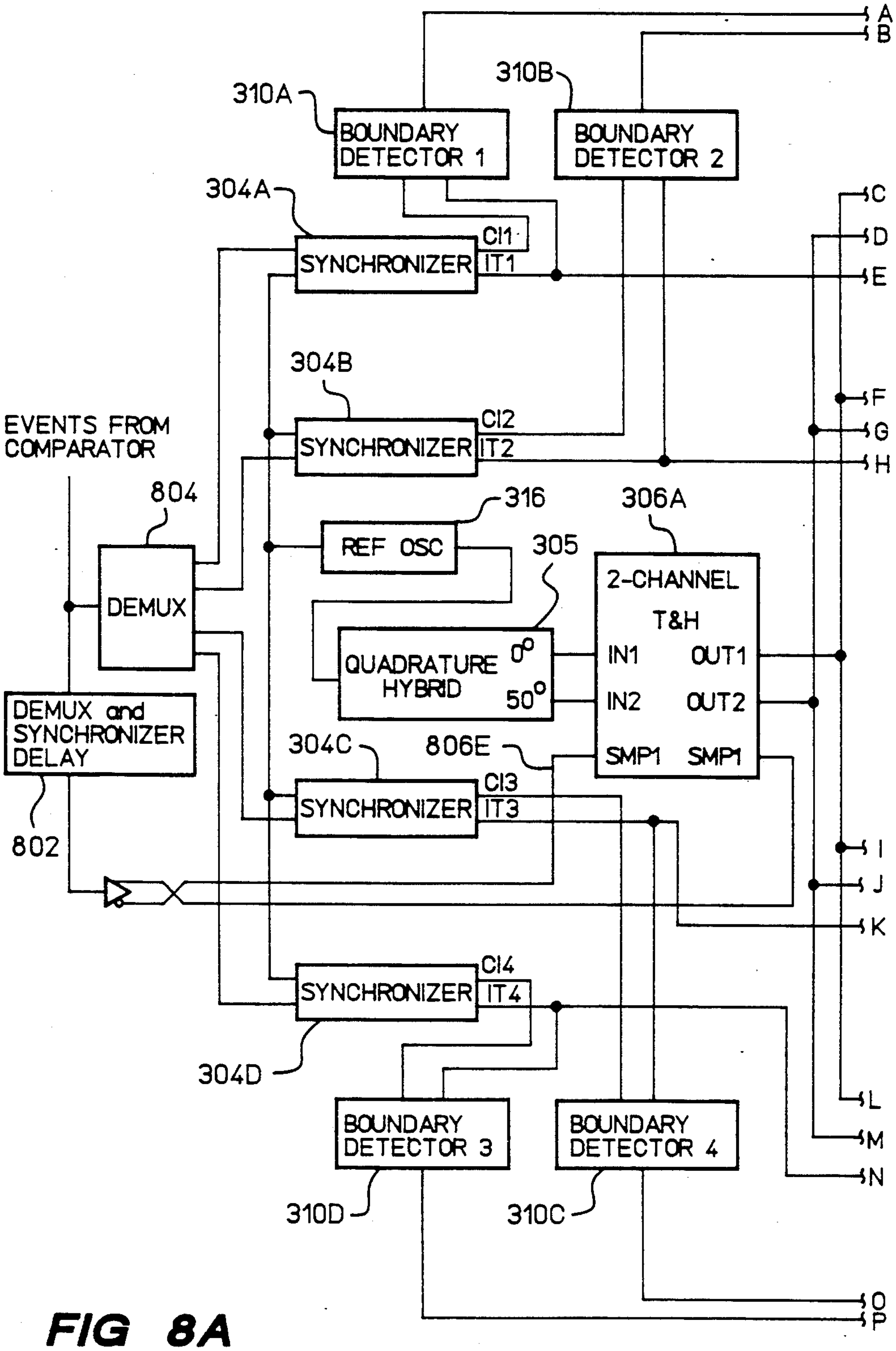
FIGS. 8A and 8B collectively illustrate a block diagram of an interleaved architecture according to the present invention.
Figure 8B:
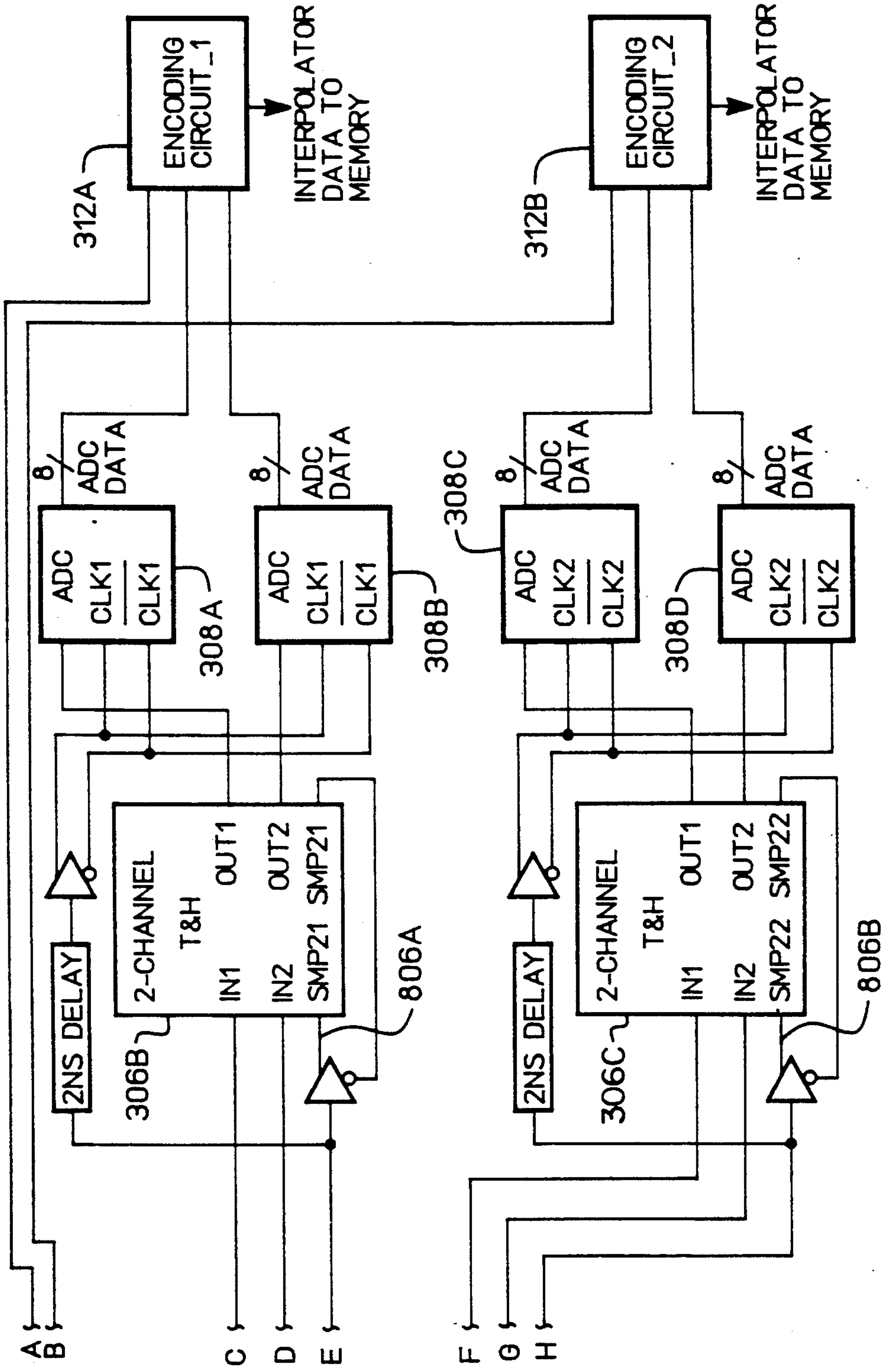
Figure 8C:
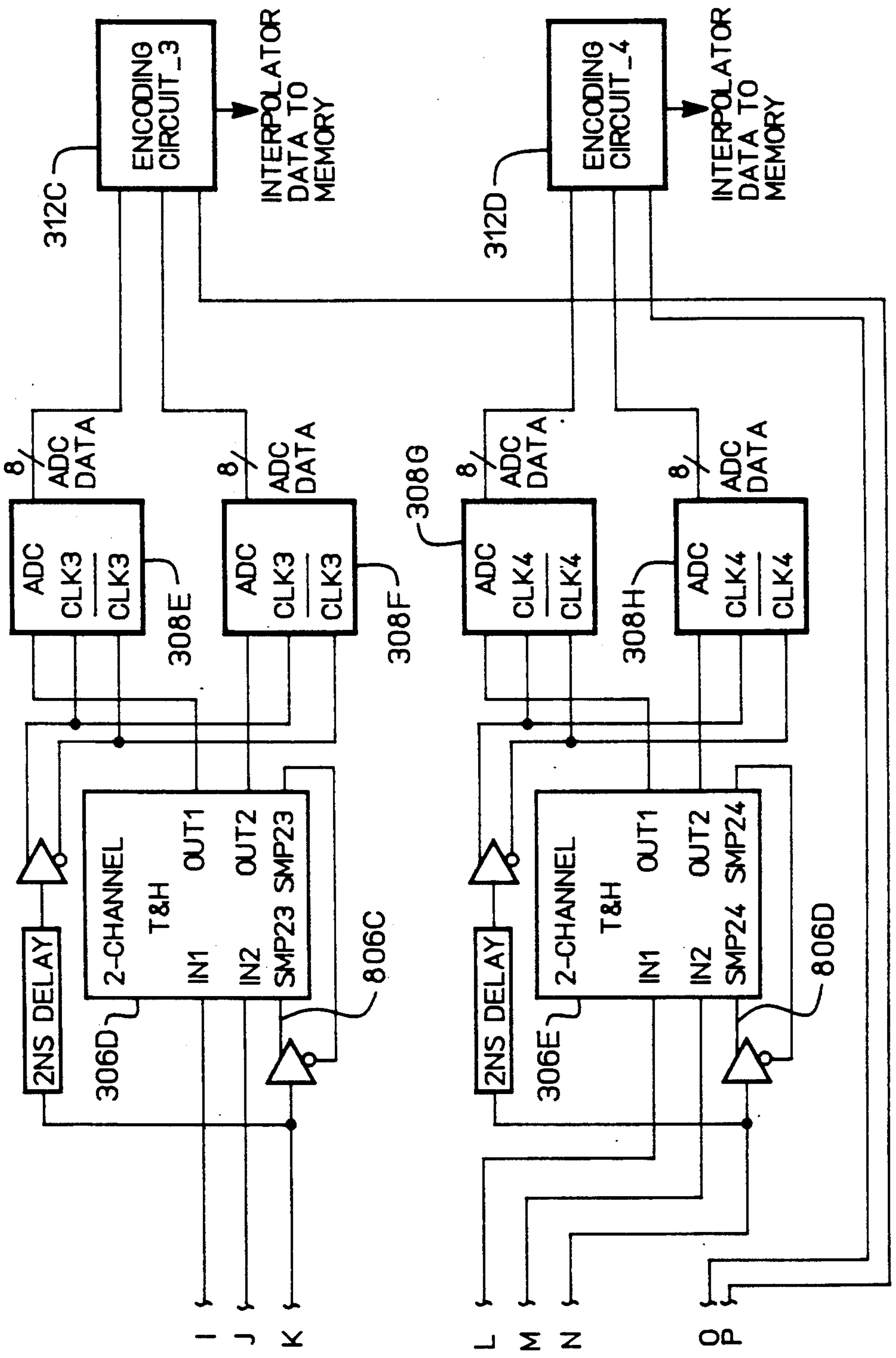
Figure 8D:
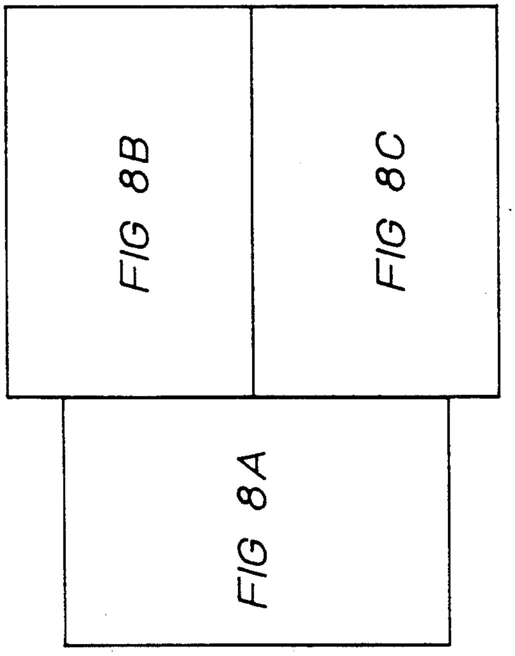
Figure 9A:
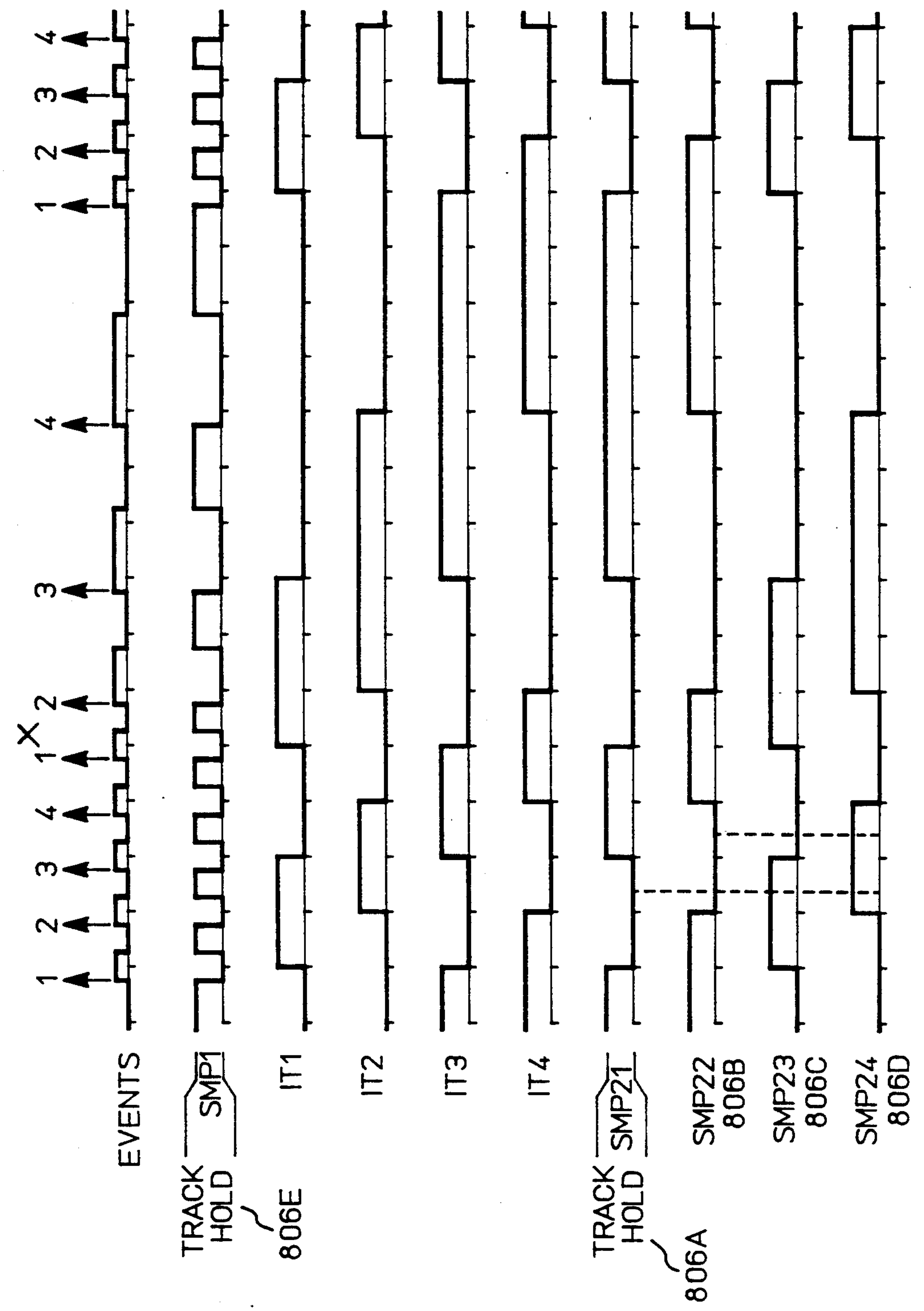
FIG. 9 illustrates a timing diagram of the interleaved architecture.
Figure 9B:
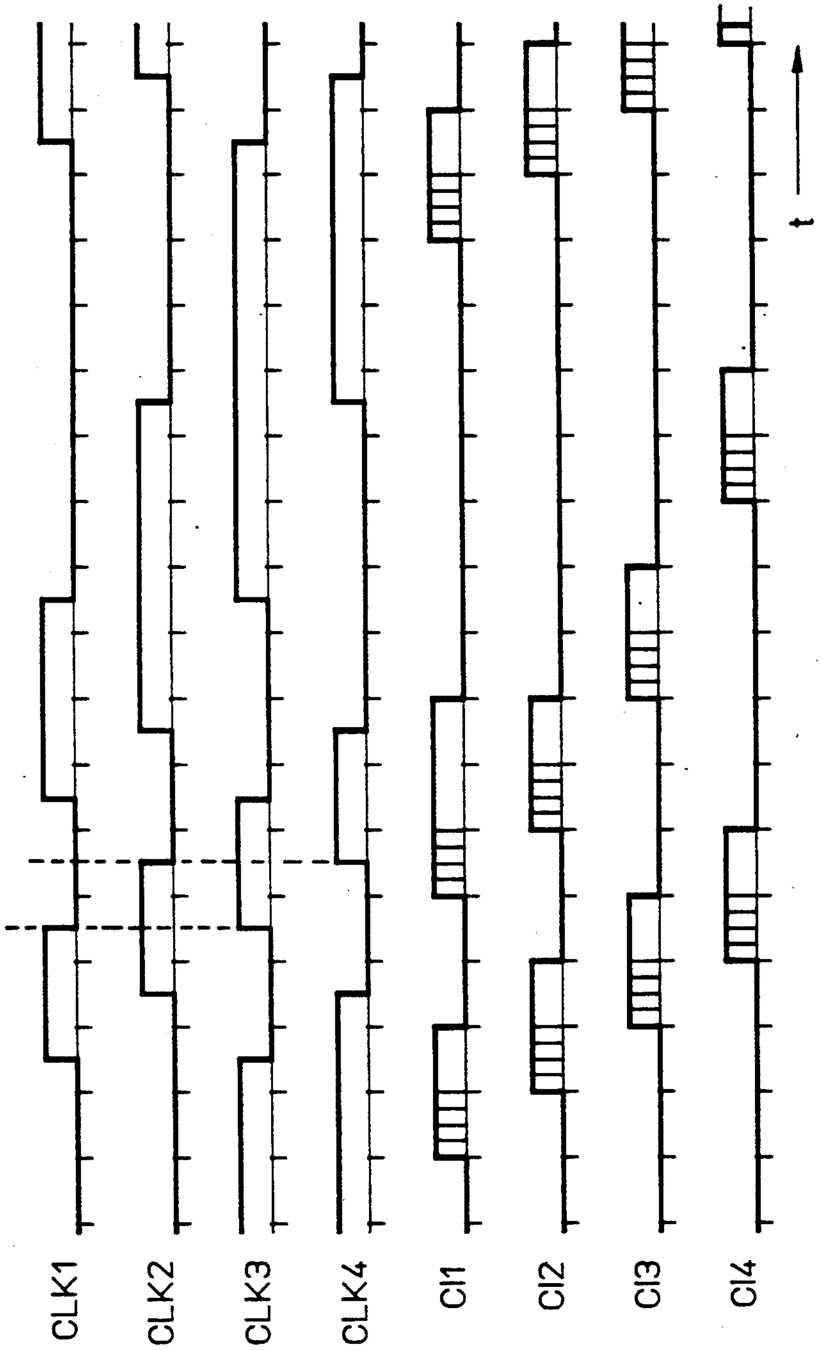
Figure 9C:
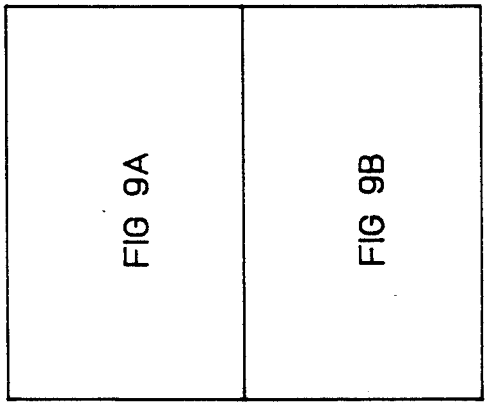

FIGS. 8A and 8B collectively illustrate a block diagram of an interleaved architecture according to the present invention. FIG. 8C illustrates the manner in which FIGS. 8A and 8B are combined. FIG. 9 illustrates a timing diagram of the interleaved architecture of FIGS. 8A and 8B.

FIGS. 8A, 8B illustrate the case of four interleaved measurement channels. This architecture can be generalized to N measurement channels by using an N output demultiplexer.

A demultiplexer 804 decelerates the event rate by a factor of N where N is the number of demultiplexer outputs. Conventional demultiplexers introduce additional time skews which add to measurement errors in traditional interpolators measuring the output of synchronizers directly. The present invention avoids measuring synchronizer outputs directly. Therefore, if a track-and-hold or other sampling device operating at higher speeds than a single synchronizer is employed at the output of a quadrature hybrid, then this interleaved architecture increases the system measurement rate to that of the sampling device without introduction of additional measurement error.

In operation, the demultiplexer 804 takes events from an input channel and sequentially distributes them to N measurement channels (each measurement channel runs at 1/Nth the rate of the input channel). Each measurement channel is the same as the block diagram shown in FIG. 3, but with one exception. In FIG. 3, a single rank track-and-hold is used. However, in the architecture of FIGS. 8A, 8B, a two rank track-and-hold is used, wherein T&H 306A represents the first rank, and T&Hs 306B, 306C, 306D, and 306E represent the second rank. The first rank T&H 306A samples at N times the single measurement channel rate.

The first rank track-and-hold 306A provides low time skew sampling of the two reference oscillator phases. This allows the second rank track-and-holds 306B, 306C, 306D, and 306E to be less critically clocked with an IT clock from the event path that goes through the demultiplexer 804. This clock may contain significant amounts of time skew without adding to measurement error because the first rank T&H 306A does the critical sampling directly and holds a stable output while it is sampled by the second rank T&Hs 306B, 306C, 306D, and 306E. Thus, some time skew in the second rank T&H 306A does not alter the voltage the second rank T&Hs 306B, 306C, 306D, and 306E acquire from the first rank T&H 306A.

4. Data Correction Possibilities

The time-to-amplitude reference may contain significant nonlinearities depending on the characteristics of the reference signal and quantizer. Data correction could be used to reduce system error. A correction procedure would include a look-up table or mapping function which would transform the non-linear response to one which was more perfectly linear. This could be implemented in hardware or software depending on system-level performance requirements.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A system for timing an event signal, comprising:

(1) a reference oscillator;

(2) quadrature hybrid means for dividing said reference oscillator into first and second signals, wherein said second signal is out of phase with said first signal by 90 degrees;

(3) means, coupled to said quadrature hybrid means, for sampling said first and second signals upon receiving the event signal;

(4) means, coupled to said sampling means, for digitizing said sampled first and second signals; and (5) encoding means, coupled to said digitizing means, for generating a fine time value according to said digitized first and second signals.

2. The system of claim 1, further comprising:

(6) means for synchronizing said reference oscillator with the event signal;

(7) boundary detection means, coupled to said synchronizing means, for quantizing a recorded coarse time count;

(8) means, coupled to said boundary detection means, for deskewing said recorded coarse time count and said fine time value; and (9) means, coupled to said encoding means and said deskewing means, for generating an interpolator output.

3. The system of claim 1, wherein said reference oscillator comprises a continuous waveform having two regions of approximately equal range and magnitude.

4. The system of claim 3, wherein said regions are linear.

5. The system of claim 3, wherein said regions are quasi-linear.

6. A method for quantizing a time difference between consecutive zero crossings of an event signal and a reference oscillator, the method comprising the steps of:

(a) dividing the reference oscillator into first and second signals, wherein said second signal is out of phase with said first signal by 90 degrees;

(b) sampling said first and second signals upon receiving the event signal;

(c) digitizing said sampled first and second signals;

(d) generating a fine time value according to said digitized first and second signals;

(e) synchronizing the reference oscillator with the event signal;

(f) quantizing a recorded coarse time count;

(g) deskewing said recorded coarse time count and said fine time value; and (h) generating an interpolator output.

7. A system for timing an event signal, comprising:

(1) a reference oscillator;

(2) quadrature hybrid means for dividing said reference oscillator into first and second signals, wherein said second signal is out of phase with said first signal by 90 degrees;

(3) means, coupled to said quadrature hybrid means, for sampling said first and second signals upon receiving the event signal;

(4) means, coupled to said sampling means, for digitizing said sampled first and second signals; and (5) encoding means, coupled to said digitizing means for generating a fine time value according to said digitized first and second signals, said encoding means including (a) means for generating said fine time value according to a first set of values indicated by said digitized first signal when said second signal is underflowed;

(b) means for generating said fine time value according to a second set of values indicated by said digitized second signal when said first signal is overflowed;

(c) means for generating said fine time value according to a third set of values indicated by said digitized first signal when said second signal is overflowed; and (d) means for generating said fine time value according to a fourth set of values indicated by said digitized second signal when said first signal is underflowed.

8. A system for timing an event signal, comprising:

(1) a reference oscillator capable of generating a continuous wave form having two regions of approximately equal range in magnitude wherein said first region spans 90 degrees with a positive slope and said second region spans 90 degrees with a negative slope;

(2) quadriture hybrid means for dividing said reference oscillator into first and second signals, wherein said second signal is out of phase with said first signal by 90 degrees;

(3) means, coupled to said quadrature hybrid means, for sampling said first and second signals upon receiving the event signal;

(4) means, coupled to said sampling means, for digitizing said sampled first and second signals; and (5) encoding means, coupled to said digitizing means, for generating a fine time value according to said digitized first and second signals.

9. A system for timing an event signal, comprising:
(1) a reference oscillator;
(2) quadrature hybrid means for dividing said reference oscillator into first and second signals, wherein said second signal is out of phase with said first signal by 90 degrees;
(3) means, coupled to said quadrature hybrid means, for sampling said first and second signals upon receiving the event signal;
(4) means, coupled to said sampling means, for digitizing said sampled first and second signals;
(5) encoding means, coupled to said digitizing means, for generating a fine time value according to said digitized first and second signals;
(6) means for synchronizing said reference oscillator with the event signal;
(7) boundary detection means, coupled to said synchronizing means, for quantizing a recorded coarse time count;
(8) deskewing means, coupled to said boundary detection means, for deskewing said recorded course time count and said fine time value, said deskewing means including
(a) means for adding said fine time value to said recorded coarse time count to produce a deskew output when said fine time value is less than a first voltage value or greater than a second voltage value;
(b) means for adding said fine time value to said recorded coarse time count and subtracting a coarse time count to produce said deskew output when said fine time value is greater than or equal to said first voltage value and quantized coarse time count is 1;
(c) means for adding said fine time value to said recorded coarse time count to produce said deskew output when said fine time value is less than or equal to said second voltage value and said quantized coarse time count is 1;
(d) means for adding said fine time value to said recorded coarse time count to produce said deskew output when said fine time value is greater than or equal to said first voltage value and said quantized coarse time count is 0; and
(e) means for adding said fine time value to said recorded coarse time count and adding a coarse time count to produce said deskew output when said fine time value is less than or equal to said second voltage value and said quantized coarse time count is 0; and
(9) means coupled to said encoding means and said deskewing means, for generating an interpolator output.

10. The system of claim 9, wherein said means for generating an interpolator output comprises means for appending said deskewed output to said fine time value, wherein bits of said deskewed output and corresponding bits of said recorded coarse time count have equal weight.

11. The system of claim 9, wherein said first and second voltage values define a region containing all skew between said recorded coarse time count and said fine time value.

12. A system for timing an event signal, comprising:
(1) a reference oscillator;
(2) quadrature hybrid means for dividing said reference oscillator into first and second signals, wherein said second signal is out of phase with said first signal by 90 degrees;
(3) means, coupled to said quadrature hybrid means, for sampling said first and second signals upon receiving the event signal;
(4) means, coupled to said sampling means, for digitizing said sampled first and second signals;
(5) encoding means, coupled to said digitizing means, for generating a fine time value according to said digitized first and second signals;
(6) means for synchronizing said reference oscillator with the event signal, said means including means for detecting a rising edge of said reference oscillator immediately following the event signal and means for generating an output edge upon such detection;
(7) boundary detection means, coupled to said synchronizing means, for quantizing a recorded coarse time count;
(8) means, coupled to said boundary detection means, for deskewing said recorded coarse time count and said fine time value; and
(9) means, coupled to said encoding means and said deskewing means, for generating an interpolar output.

13. The system of claim 12, wherein said boundary detection means comprises:
(a) means for delaying the event signal; and
(b) means for latching said output edge upon receiving said delayed event signal.

14. A method for quantizing a time difference between consecutive zero crossings of an event signal and a reference oscillator, the method comprising the steps of:
(a) dividing the reference oscillator into first and second signals, wherein said second signal is out of phase with said first signal by 90 degrees;
(b) sampling said first and second signals upon receiving the event signal;
(c) digitizing said sampled first and second signals;
(d) generating a fine time valve according to said digitized first and second signals;
(e) synchronizing the reference oscillator with the event signal by detecting a rising edge of the reference oscillator immediately following the events signal and generating an output edge upon said detection;
(f) quantizing a recorded coarse time count;
(g) deskewing said recorded coarse time count and said fine time value; and
(h) generating an interpolator output.

15. The method of claim 14, wherein said step for quantizing a recorded coarse time count comprises the steps of:
delaying the event signal; and
latching said output edge upon receiving said delayed event signal.

16. A method for quantizing a time difference between consecutive zero crossings of an event signal and a reference oscillator, the method comprising the steps of:
(a) dividing the reference oscillator into first and second signals, wherein said second signal is out of phase with said first signal by 90 degrees;
(b) sampling said first and second signals upon receiving the event signal;

(c) digitizing said sampled first and second signals;
(d) generating a fine time value according to said digitized first and second signals;
(e) synchronizing the reference oscillator with the event signal by detecting a rising edge of the reference oscillator immediately following the event signal and generating an output edge upon said detection;
(f) quantizing a recorded coarse time count;
(g) adding said fine time value to said recorded coarse time count to produce a deskew output when said fine time value is less than a first voltage value or greater than a second voltage value;
(h) adding said fine time value to said recorded coarse time count and subtracting a coarse time count to produce said deskew output when said fine time value is greater than or equal to said first voltage value and said quantized coarse time count is 1;
(i) adding said fine time value to said recorded coarse time count to produce said deskew output when said fine time value is less than or equal to said second voltage value and said quantized coarse time count is 1;
(j) adding said fine time value to said recorded coarse time count to produce said deskew output when said fine time value is greater than or equal to said first voltage value and said quantized coarse time count is 0; and
(k) adding said fine time value to said recorded coarse time count and adding a coarse time count to produce said deskew output when said fine time value is less than or equal to said second voltage value and said quantized coarse time count is 0;
(l) generating an interpolator output.

17. The method of claim 16, wherein said step for generating an interpolator output comprises the step of appending said deskewed output to said fine time value, wherein bits of said deskewed output and corresponding bits of said recorded coarse time count have equal weight.

18. A method for quantizing a time difference between consecutive zero crossings of an event signal and a reference oscillator, the method comprising the steps of:
(a) dividing the reference oscillator into first and second signals, wherein said second signal is out of phase with said first signal by 90 degrees;
(b) sampling said first and second signals upon receiving the event signal;
(c) digitizing said sampled first and second signals;
(d) generating a fine time value according to said digitized first and second signals by
  (1) generating said fine time value according to a first set of values indicated by said digitized first signal when said second signal is underflowed,
  (2) generating said fine time value according to a second set of values indicated by said digitized second signal when said first signal is overflowed,
  (3) generating said fine time value according to a third set of value indicated by said digitized first signal when said second signal is overflowed, and
  (4) generating said fine time value according to a fourth set of values indicated by said digitized second signal when said first signal is underflowed;
(e) synchronizing the reference oscillator with the event signal;
(f) quantizing a recorded coarse time count;
(g) deskewing said recorded coarse time count and said fine time value; and
(h) generating an interpolator output.

* * * * *